(12) United States Patent
Ishii et al.

(10) Patent No.: US 6,929,523 B2
(45) Date of Patent: Aug. 16, 2005

(54) DEVICE PACKAGE WITH HERMETICALLY SEALED CAP AND DEVICE ENCAPSULATION METHOD

(75) Inventors: Ikuko Ishii, Tokyo (JP); Yoshikazu Sakaguchi, Tokyo (JP)

(73) Assignee: Samsung SDI Co., Ltd., Suwon (KR)

(*) Notice: Subject to any disclaimer, the term of this patent is extended or adjusted under 35 U.S.C. 154(b) by 29 days.

(21) Appl. No.: 10/953,346

(22) Filed: Sep. 30, 2004

(65) Prior Publication Data

US 2005/0057155 A1 Mar. 17, 2005

Related U.S. Application Data

(60) Continuation of application No. 10/314,600, filed on Dec. 9, 2002, now Pat. No. 6,828,728, which is a division of application No. 09/310,326, filed on May 12, 1999, now Pat. No. 6,520,821.

(30) Foreign Application Priority Data

May 18, 1998 (JP) .......................................... 10-134969

(51) Int. Cl.$^7$ .................................................. H01J 9/40
(52) U.S. Cl. ............................... 445/23; 445/24; 445/25
(58) Field of Search ............................... 445/23–25, 50, 445/51

(56) References Cited

FOREIGN PATENT DOCUMENTS

| JP | 59-129447 | 7/1984 |
|---|---|---|
| JP | 61-48697 | 4/1986 |
| JP | 08-330352 | 12/1996 |

*Primary Examiner*—Joseph Williams
(74) *Attorney, Agent, or Firm*—McGuireWoods LLP

(57) ABSTRACT

In a device encapsulation method, an organic EL device is formed on a substrate. An encapsulation cap is placed on the substrate to surround the device and thereafter an end face of the cap is welded on at least the substrate. A device package is also disclosed.

23 Claims, 3 Drawing Sheets

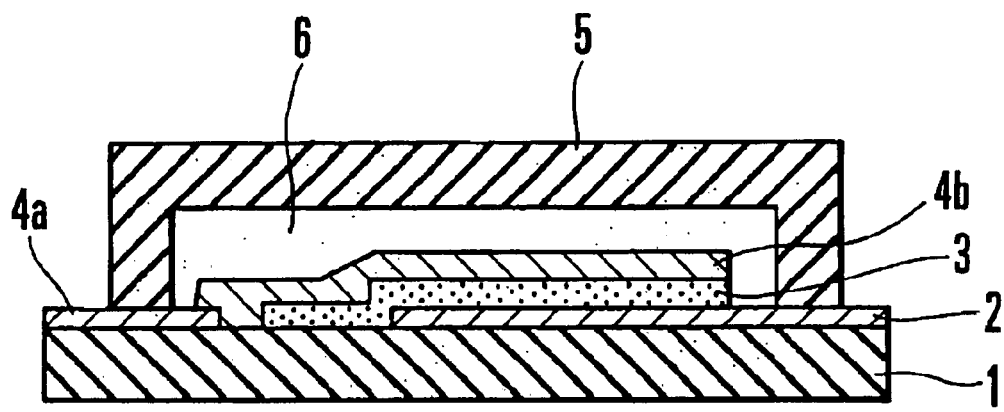
F I G. 2
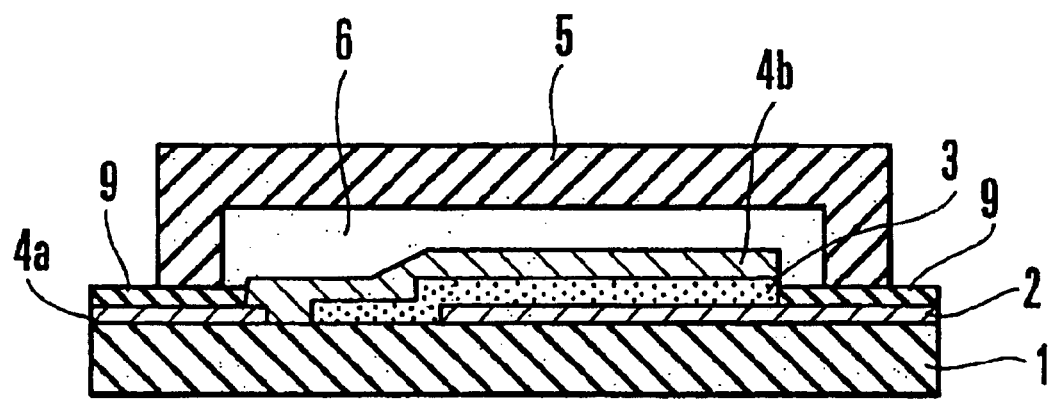
F I G. 3

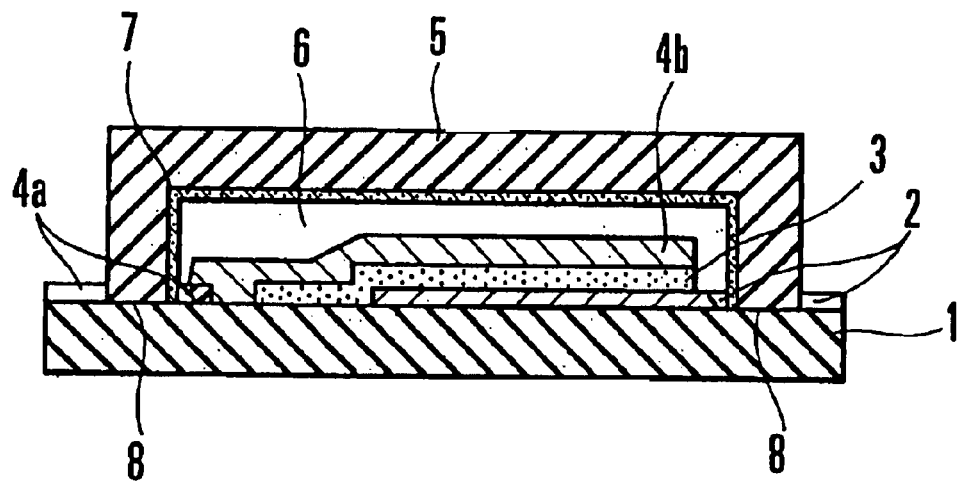
F I G. 4

DEVICE PACKAGE WITH HERMETICALLY SEALED CAP AND DEVICE ENCAPSULATION METHOD

CROSS-REFERENCE TO RELATED APPLICATIONS

The present application is a continuation application of and claims priority under 37 U.S.C. § 120 to U.S. patent application Ser. No. 10/314,600 which was filed on Dec. 9, 2002 now U.S. Pat. No. 6,828,728, which is a divisional application of U.S. patent application Ser. No. 09/310,326 filed on May 12, 1999, now U.S. Pat. No. 6,520,821, which claims priority to Japanese Patent Application No. 134969/1998, filed on May 18, 1998, now Japanese Patent Publication Number 11-329718, each of which is herein incorporated by reference in its entirety.

BACKGROUND OF THE INVENTION

The present invention relates to a device package and a device encapsulation method and, more particularly, to an organic electroluminescence (EL) device package and an encapsulation method of encapsulating an organic EL device in a package.

An organic EL device is formed by interposing a multi-layered structure constituted by a light-emitting layer and a hole injection layer/electron injection layer between a pair of electrodes on a substrate. The multilayered structure is constituted by a light-emitting layer made of a fluorescent organic solid such as anthracene and a hole injection layer made of a triphenyl amine derivative or the like; a light-emitting layer and an electron injection layer made of a perylene derivative; or a hole injection layer, a light-emitting layer, and an electron injection layer.

The organic EL device formed in this manner utilizes an emission phenomenon which occurs when electrons and holes injected into the light-emitting layer are recombined. Hence, if the thickness of the light-emitting layer of the organic EL device is decreased, the organic EL device can be driven at a low voltage of, e.g., about 4 V, and has a high response speed.

The fluorescent organic solid as the material of the light-emitting layer of the organic EL device is not resistant to water and oxygen. The characteristics of the electrodes formed on the light-emitting layer directly or through the hole injection layer/electron injection layer tend to be degraded due to oxidation. As a result, if a conventional organic EL device is driven in the atmosphere, its emission characteristics are sharply degraded. To obtain a practical organic EL device, the device must be encapsulated so that water or oxygen does not enter the light-emitting layer, thereby prolonging the service life.

As the encapsulation structure, a structure in which a resin or the like is directly applied to the organic EL device, or a structure in which a gas or liquid is filled in the encapsulation space is available. A filled structure type organic EL device encapsulation method will be described with reference to FIG. 5. As shown in FIG. 5, an anode 12 and a cathode 14a each formed of an indium-tin oxide (ITO) film, an organic EL device 13, and a cathode 14b formed of a metal film are sequentially formed on a glass substrate 11 to form an organic EL device. An encapsulation cap 15 made of glass is placed on the substrate 11 and adhered with an adhesive 18 to encapsulate the organic EL device.

The encapsulation cap 15 has such a shape that it can maintain a hollow portion 16 to be filled with an inert gas. Because of the poor heat resistance of the organic EL device, the substrate 11 and cap 15 are bonded to each other by using room-temperature curing or the UV curing adhesive 18.

In the conventional encapsulation method described above, an interface is present between the substrate 11 and adhesive 18 and between the cap 15 and adhesive 18. Accordingly, external oxygen or water enters from the outside at the interface to cause degradation of the organic EL device, thus shortening the service life of the organic EL device.

SUMMARY OF THE INVENTION

It is an object of the present invention to provide a device package that can prolong the service life of the device, and a device encapsulation method.

In order to achieve the above object, according to the present invention, there is provided a device encapsulation method comprising the steps of forming a device having an anode and a cathode on a substrate made of a thermoplastic resin, and placing a cap made of the same thermoplastic resin as that forming the substrate on the substrate to surround the device and thereafter welding an end face of the cap on at least the substrate.

BRIEF DESCRIPTION OF THE DRAWINGS

FIG. 2 is a longitudinal sectional view of a portion of the organic EL device shown in FIG. 1B where an anode and a cathode are not formed;

FIG. 3 is a longitudinal sectional view of an organic EL device according to the second embodiment of the present invention;

FIG. 4 is a longitudinal sectional view of an organic EL device according to the third embodiment of the present invention.

DESCRIPTION OF THE PREFERRED EMBODIMENTS

The present invention will be described in detail with reference to the accompanying drawings.

[First Embodiment]

Figure 1A:
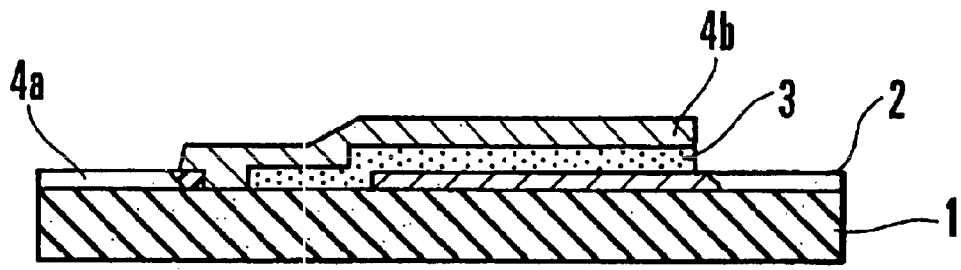
FIGS. 1A and 1B are views showing the steps in manufacturing an organic EL device according to the first embodiment of the present invention.
Figure 1B:
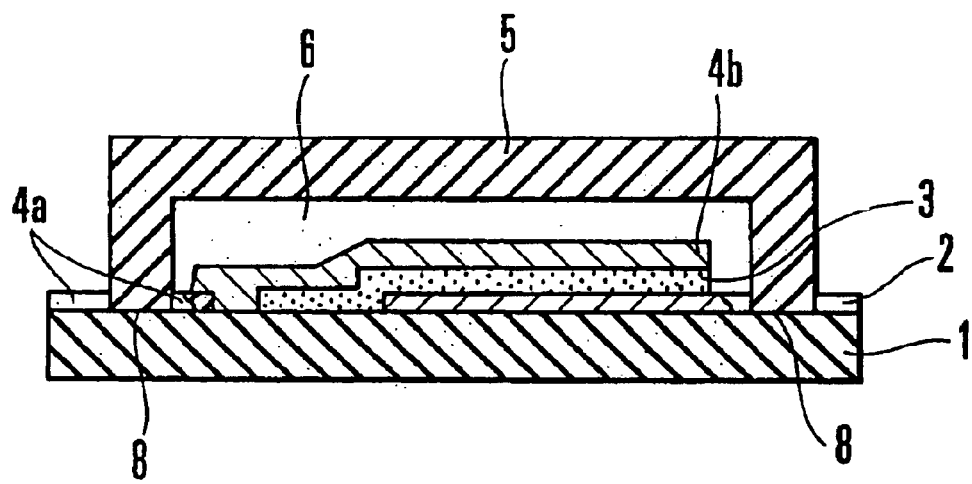

FIGS. 1A and 1B show the steps in manufacturing an organic EL device according to the first embodiment of the present invention. In FIGS. 1A and 1B, the respective portions are illustrated with easily recognizable sizes for the sake of illustrative convenience and accordingly have a film ratio different from the actual one.

As shown in FIG. 1A, an anode 2 and a cathode 4a each formed of an ITO film, an organic EL device 3, and a metal cathode 4b are sequentially formed on a substrate 1. As shown in FIG. 1B, a box- or dome-shaped encapsulation cap 5 made of the same material as that of the substrate 1 and having one open surface is placed on the substrate 1, and its end face and the substrate 1 are welded by using ultrasonic welding. The encapsulation cap 5 has such a shape that it can maintain a hollow portion 6, so that it will not come into direct contact with the cathode 4b. The hollow portion 6 is filled with a gas containing neither oxygen nor water.

As the material of the substrate 1 on which the organic EL device 3 is mounted, an amorphous thermoplastic resin is used. Examples of the amorphous thermoplastic resin are an AS resin, an ABS resin, polypropyrene (PP), polystyrene (HIPS), polymethyl methacrylic acid (PMMA), polycarbonate (PC), and polyoxymethylene (POM).

According to this embodiment, the substrate 1 and encapsulation cap 5 made of the same material are welded to each other. As the substrate 1 and encapsulation cap 5 are integrated and accordingly do not have an interface between them, the internal hermeticity can be maintained for a long period of time.

A method of manufacturing the organic EL device 3 and a method of encapsulating the organic EL device 3 will be described in detail.

To fabricate the organic EL device 3 as the encapsulation target, for example, a 0.5 mm thick polycarbonate (PC) substrate 1 formed with a 100 nm thick ITO film by sputtering was prepared as a transparent support substrate. The ITO film is used as the anode 2 and cathode 4a for external connection and must perform display by transmitting light generated by the organic EL layer. Hence, the ITO film preferably has high light transmittance as in inorganic glass.

The transparent support substrate is fixed to a substrate holder in a vacuum deposition apparatus such that the ITO film is located below. As a hole injection/hole transport material, an aromatic diamine such as N,N'-diphenyl-N,N'-bis($\alpha$-naphthyl)-1,1'-biphenyl-4,4'-d iamine (to be referred to as $\alpha$-NPD hereinafter) is put in a resistance heating boat. As an organic light-emitting material, a tris(8-quinolinolate) aluminum complex (to be referred to as Alq3 hereinafter) is put in another resistance heating boat, and the interior of the vacuum deposition apparatus is evacuated to about $1\times10^{-4}$ Pa or less with a vacuum pump.

Subsequently, a metal shadow mask, from which a region where a hole transport layer and an EL light-emitting layer are to be formed by vacuum deposition is removed, is set on the anode side of the transparent support substrate so as to be fixed to the substrate. A current is supplied to the transparent support substrate and the resistance heating boat loaded with $\alpha$-NPD and placed below the shadow mask to heat $\alpha$-NPD. An $\alpha$-NPD layer having a thickness of about 50 nm is deposited to form the hole transport layer.

A current is supplied to the resistance heating boat loaded with Alq3 to heat Alq3. An alq3 layer having a thickness of 50 nm is thus formed by vacuum deposition, thus forming a green emission layer. Magnesium and silver are formed by vacuum deposition to a thickness of 200 nm to form the cathode 4b. An organic EL device as the encapsulation target is thus fabricated.

Part of the anode 2 formed of the ITO film and part of the cathode 4b formed of a magnesium-silver alloy layer also serve as electrode wires for external connection. In this case, the cathode 4b may be alternatively directly extracted outside the package. Regarding the welding portion of the substrate 1 and encapsulation cap 5, it preferably has a high heat resistance. Hence, the ITO film is used to form the cathode 4a of the welding portion. Pixels each having a size of 0.3 mm×0.3 mm are arranged in the light-emitting layer into a matrix.

In a box filled with nitrogen gas having a dew point of −72° C., the encapsulation cap 5 is placed on the substrate 1 formed with the organic EL device 3. In this box, a bonding portion 8 of the substrate 1 and the end face of the encapsulation cap 5 is vibrated and pressurized in a predetermined direction with ultrasonic honing, thus performing hermetic encapsulation. The width of the bonding portion (welding portion) 8 of the substrate 1 and encapsulation cap 5 is 3 mm. The frequency for honing is set to 15 kHz, and the pressure for pressurization is set to 10 kg/cm$^2$ as the primary pressure and 12 kg/cm$^2$ as the secondary pressure. The time required for this welding is about 3 seconds. The time required for encapsulation process can thus be shortened.

A DC constant current power supply was connected to the organic EL device 3, encapsulated in the package constituted by the substrate 1 and encapsulation cap 5 in the above manner, through the anode 2 and cathode 4a serving as the electrode wires extracted outside the package. Power was supplied to the organic EL device 3 to an initial luminance of 100 cd/m$^2$ at 25° C. in the atmospheric pressure. At this time, the current was 10 mA and the voltage was 9 V. Following this energization, an enlarged picture (×30) of the emission surface was photographed. The ratio of the dark spot (non-emission portion) in a plan view to the total area of the emission surface (to be referred to as the ratio of the non-emission area) was calculated from this photograph to be 0.5%. The diameter of certain one spot was measured to be 7 $\mu$m.

This organic EL device was left to stand for 500 hours at 50° C. in a 90% RH atmosphere without being energized. The non-emission area ratio was calculated to be 0.8% in the same manner as that described above. Therefore, it was confirmed that the non-emission area ratio did not substantially change from the initial value. The diameter of the same dark spot as that measured before leaving in the 90% RH atmosphere was measured again to be 10 $\mu$m. The diameter did not substantially change from the initial value.

Figure 5:
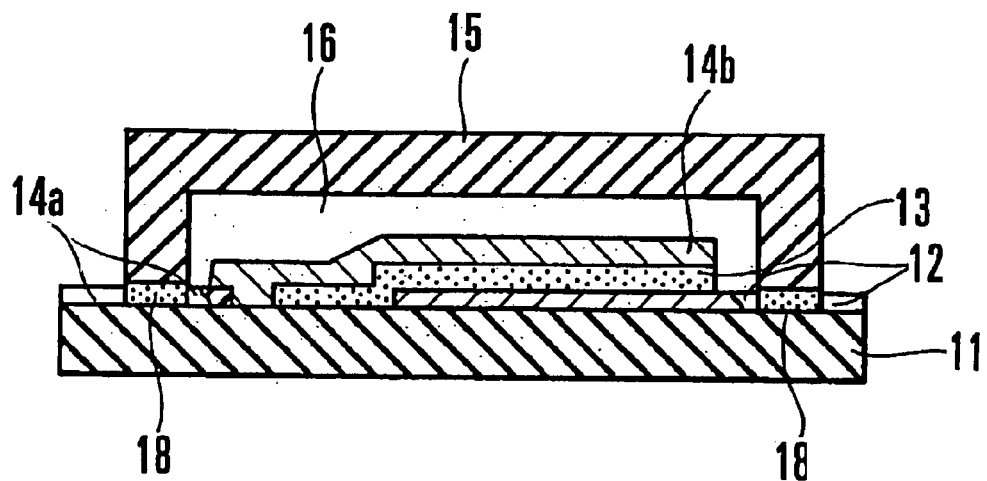
FIG. 5 is a longitudinal sectional view of a conventional organic EL device.

In contrast to this, the conventional organic EL device shown in FIG. 5 was evaluated in the same manner as that described above. The result of this evaluation is as follows. The initial non-emission area ratio was calculated to be 0.4%. The diameter of certain one dark spot was measured to be 6 $\mu$m. This device was left to stand for 500 hours at 50° C. in the 90% RH atmosphere without being energized. The non-emission area ratio was calculated to be 3.6%. When the diameter of the same dark spot as that measured before leaving in the 90% RH atmosphere was measured again, it grew to 20 $\mu$m.

As described above, according to the encapsulation method of this embodiment, growth of the dark spot can be suppressed when compared to the prior art.

The anode 2 and cathode 4a have elongated shapes, and a plurality of rows of anodes 2 and a plurality of rows of cathodes 4a are formed at predetermined pitches. Each of FIGS. 1A and 1B shows the longitudinal section of a portion of the organic EL device where the anode 2 and cathode 4a are not formed. For the sake of illustrative convenience, the entire portion of the organic EL device 3 and part of the anode 2 and cathode 4a are shown as a section. Accordingly, the encapsulation cap 5 is directly welded to the substrate 1 through portions of the bonding portion 8 where the anode 2 and cathode 4a are absent.

FIG. 2 shows a portion of the organic EL device where the anode 2 and cathode 4a are formed. In FIG. 2, the end face of the encapsulation cap 5 is in contact with the surfaces of the anode 2 and cathode 4a.

[Second Embodiment]

As the second embodiment, in FIG. 3, in order to improve the adhesion properties of welding of a substrate 1 and an encapsulation cap 5, a resin layer 9 made of the same material as that of the substrate 1 is formed by coating in advance on an anode 2 and a cathode 4a that are present between the substrate 1 and encapsulation cap 5. The substrate 1 and encapsulation cap 5 are then welded to each other. At this time, the encapsulation cap 5 is welded to the resin layer 9 at regions on the anode 2 and cathode 4a.

A result obtained by evaluating the organic EL device of this embodiment in accordance with the same method as in the first embodiment is as follows. In contrast to an initial non-emission area ratio of 0.5%, the non-emission area ratio obtained after the organic EL device was left to stand for 500 hours at 50 in the 90% RH atmosphere without being driven was 0.7%. Regarding the dark spot diameter, in contrast to an initial value of 5 µm, the value obtained after the organic EL device was left to stand for 500 hours at 50° C. in the 90% RH atmosphere without being driven was 7 µm. In this manner, a better effect than that of the first embodiment was confirmed.

In the first and second embodiments, the encapsulation cap 5 is transparent. As a modification, the entire portion of the encapsulation cap 5, excluding its inner wall or surface bonded with the substrate 1, is colored in black so as to absorb light, and the substrate 1 and encapsulation cap 5 are welded to each other. This can improve the contrast of organic EL emission. Where the conventional contrast is 1:7 to 1:10, in this modification, the contrast is improved to 1:70 to 1:90.

[Third Embodiment]

FIG. 4 shows an organic EL device according to the third embodiment of the present invention. In FIG. 4, portions having the same arrangement as those of FIG. 1B are denoted by the same reference numerals as in FIG. 1B. In the third embodiment, an active carbon layer 7 is formed on the inner wall of an encapsulation cap 5, and thereafter a substrate 1 and the encapsulation cap 5 are welded to each other. This can improve the contrast of organic EL emission, in the same manner as in the above modification. Since a fusion gas generated during ultrasonic welding of the substrate 1 and encapsulation cap 5 is adsorbed by the active carbon layer 7, the service life of the organic EL device can be further prolonged.

A result obtained by evaluating the organic EL device of this embodiment in accordance with the same method as in the first embodiment is as follows. In contrast to an initial non-emission area ratio of 0.4%, the non-emission area ratio obtained after the organic EL device was left to stand for 500 hours at 50° C. in the 90% RH atmosphere without being driven was 0.5%, exhibiting substantially no change. Regarding the dark spot diameter, in contrast to an initial value of 5 µm, the value obtained after the organic EL device was left to stand for 500 hours at 50° C. in the 90% RH atmosphere without being driven was 6 µm. A better effect than that of the above modification was confirmed.

As has been described above, according to the present invention, when a substrate and a cap made of the same material are welded to each other, the interface between the substrate and cap can be eliminated. The hermeticity in the package can thus be improved, thus prolonging the service life of the organic EL device.

When the same material as in the substrate is applied in advance to an anode and a cathode present on the welding portion of the substrate and cap, the adhesion properties of the substrate and cap can be improved, thus further prolonging the service life of the organic EL device.

When the inner wall or entire portion of the cap is colored, the contrast of organic EL emission can be improved.

When an active carbon layer is formed on the inner wall of the cap, the contrast of the organic EL emission can improved, and the service life of the organic EL device can be further prolonged.

What is claimed is:

1. A method for encapsulating a device, comprising:
   forming a device having an anode and a cathode on a substrate;
   placing a cap made of a same material as that forming the substrate and having a hollow portion and an open surface to surround the device;
   filling the hollow portion with a gas that contains neither oxygen nor water; and
   welding an end face of the cap by pressurization to form a hermetic seal, wherein the pressurization includes a primary pressurization and a secondary pressurization.

2. The method of claim 1, wherein the welding an end face of the cap by pressurization further comprises welding by ultrasonic vibration with the welding by pressurization.

3. The method of claim 1, wherein the pressure of the secondary pressurization is higher than the pressure of the primary pressurization.

4. The method of claim 1, further comprising a step of:
   forming an externally extending portion of the anode and an externally extending portion of the cathode to serve as electrode wires for external connection.

5. A method of claim 4, further comprising a step of:
   forming a resin layer made of same material as that forming the substrate on externally extending portions of the anode and the cathode,
   wherein welding an end face of the cap further includes welding the end face of the cap to the resin layer.

6. The method of claim 1, wherein the step of welding is performed in nitrogen atmosphere.

7. The method of claim 1, wherein the substrate is made of a thermoplastic resin.

8. A method of claim 7, the thermoplastic resin is one material selected from the group consisting of an AS resin, an ABS resin, polypropyrene(PP), polystyrene(HIPS), polymethylmethacrylic acid(PMMA), polycarbonate(PC), and polyoxymethylene(POM).

9. The method of claim 1, wherein the substrate is a thermoplastic transparent resin substrate.

10. The method of claim 1, further comprising the step of coloring an inner surface of the cap before placing the cap to surround the device.

11. The method of claim 1, further comprising:
    forming an active carbon layer on an inner surface of the cap before placing the cap to surround the device, wherein the active carbon layer absorbs a fusion gas generated during the step of welding.

12. The method of claim 1, wherein the device further includes an organic EL device formed between the anode and the cathode, the anode is formed of an indium tin-oxide (ITO) film, and the cathode is formed of a magnesium-silver alloy.

13. The method of claim 1, wherein welding an end face of the cap further includes welding the end face directly to the substrate through portions where the anode and cathode are absent.

14. The method of claim 1, wherein the substrate and the cap are both transparent.

15. The method of claim 1, further comprising:
    coloring an entire portion of the cap, excluding its inner surface or the welded end surface, in black to absorb light and improve contrast of organic electroluminescent emission.

16. The method of claim 15, wherein a display contrast is improved from a conventional range of about 1:7–1:10 to a range of about 1:70 to 1:90.

17. A method for encapsulating a device, comprising:
    forming an anode and a cathode on a substrate, the anode and the cathode each having an externally extending portion to serve as electrode wires for external connection;

forming an organic electroluminescent (EL) device between the anode and the cathode;

surrounding the above elements in a gas that contains neither oxygen nor water;

placing a transparent cap made of a same material as that forming the substrate within the gas to surround the organic EL device so that the cap is filled with the gas; and welding with a primary and secondary pressurization, within the gas, an end face of the transparent cap to form a hermetic seal, wherein the pressure of the secondary pressurization is higher than the pressure of the primary pressurization.

18. The method of claim 17, wherein the gas is nitrogen.

19. The method of claim 17, wherein the welding further includes welding with ultrasonic vibration.

20. The method of claim 17, wherein the end face is welded to directly contact with the substrate.

21. The method of claim 17, further comprising:

coloring an inner surface of the transparent cap before the step of placing the transparent cap to surround the device.

22. The method of claim 17, further comprising:

coating the anode and the cathode with a resin layer made of the same material as that of the substrate before placing the transparent cap;

wherein the end face of the cap is welded to directly contact the resin layer at one of a region on the anode or a region of the cathode.

23. The method of claim 17, wherein the end face is welded to directly contact one of the externally extending portion of the anode or the externally extending portion of the cathode.

* * * * *